US012232434B2

(12) United States Patent
Lee et al.

(10) Patent No.: US 12,232,434 B2
(45) Date of Patent: Feb. 18, 2025

(54) MULTI-DOPED DATA STORAGE STRUCTURE CONFIGURED TO IMPROVE RESISTIVE MEMORY CELL PERFORMANCE

(71) Applicant: Taiwan Semiconductor Manufacturing Company, Ltd., Hsin-Chu (TW)

(72) Inventors: Bi-Shen Lee, Hsin-Chu (TW); Hai-Dang Trinh, Hsinchu (TW); Fa-Shen Jiang, Taoyuan (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 17/854,982

(22) Filed: Jun. 30, 2022

(65) Prior Publication Data

US 2022/0336737 A1 Oct. 20, 2022

Related U.S. Application Data

(62) Division of application No. 16/940,529, filed on Jul. 28, 2020, now Pat. No. 11,404,638.

(51) Int. Cl.
*H10N 70/00* (2023.01)
*G11C 13/00* (2006.01)

(52) U.S. Cl.
CPC ..... *H10N 70/8265* (2023.02); *G11C 13/0007* (2013.01); *H10N 70/841* (2023.02); *H10N 70/8833* (2023.02)

(58) Field of Classification Search
CPC ............. H10N 70/8265; H10N 70/841; H10N 70/8833; H10N 70/881; H10N 70/023; G11C 13/0007; H10B 63/30
See application file for complete search history.

(56) References Cited

U.S. PATENT DOCUMENTS

| | | | |
|---|---|---|---|
| 8,450,715 | B2 | 5/2013 | Takano |
| 9,012,260 | B2 | 4/2015 | Barabash |
| 9,799,705 | B1 | 10/2017 | Yi et al. |
| 10,355,205 | B2 | 7/2019 | Majhi et al. |

(Continued)

FOREIGN PATENT DOCUMENTS

CN 110752289 A 2/2020

OTHER PUBLICATIONS

Minjae Kim et al., N-doped Al2O3 thin films deposited by atomic layer deposition, Thin Solid Films 660 (2018) 657-662 (Year: 2018).*

P. Katiyar et al., Electrical properties of amorphous aluminum oxide thin films, Acta Materialia 53 (2005) 2617-2622 (Year: 2005).*

Kim et al. "Current Conduction Mechanism of Nitrogen-Doped AlOx RRAM." IEEE Transactions On Electron Devices, vol. 61, No. 6, Jun. 2014.

(Continued)

*Primary Examiner* — Shih Tsun A Chou
(74) *Attorney, Agent, or Firm* — Eschweiler & Potashnik, LLC

(57) ABSTRACT

Various embodiments of the present disclosure are directed towards a method for forming an integrated chip. The method includes forming a bottom electrode over a substrate. A data storage structure is formed on the bottom electrode. The data storage structure comprises a first dopant with a first atomic percent and a second dopant with a second atomic percent. The first atomic percent is different from the second atomic percent. A top electrode is formed on the data storage structure.

20 Claims, 7 Drawing Sheets

600
224
222
220
112
110
104
114
106
604
602
108
216
218
214
208
102
212
210
202
204
206

(56) References Cited

U.S. PATENT DOCUMENTS

2011/0068316 A1* 3/2011 Takano .................. H10B 63/20 257/4
2011/0095259 A1* 4/2011 Lee .................... H10N 70/8833 257/4
2011/0182108 A1 7/2011 Williams et al.
2012/0153249 A1 6/2012 Zhang et al.
2015/0028278 A1* 1/2015 Lee ................... H01L 29/42324 257/2
2015/0255267 A1* 9/2015 Tapily ................... H01L 29/513 438/763
2016/0028003 A1 1/2016 Wang
2018/0090207 A1* 3/2018 Hou ..................... H10N 70/021
2018/0269390 A1 9/2018 Saitoh et al.
2018/0375024 A1 12/2018 Chu et al.
2019/0036020 A1* 1/2019 Majhi .................. H10N 70/826
2019/0115533 A1 4/2019 Borowski et al.
2019/0122732 A1* 4/2019 Jo ........................ G11C 13/003
2019/0214556 A1 7/2019 Chen et al.
2019/0244661 A1* 8/2019 Kim .................... G11C 11/1659
2019/0393413 A1* 12/2019 Ando ..................... H10N 70/20
2020/0044152 A1* 2/2020 Yu ......................... C23C 14/345

OTHER PUBLICATIONS

Wong et al. "Metal-Oxide RRAM." Proceedings of the IEEE, vol. 100, No. 6, Jun. 2012.
Yang et al. "Role of nitrogen incorporation into Al2O3-based resistive random-access memory." Applied Physics Express 7, 074202 (2014), published Jun. 17, 2014.
U.S. Appl. No. 16/807,564, filed Mar. 3, 2020.
Non-Final Office Action in connection with U.S. Appl. No. 16/807,564 dated Jun. 25, 2021.
Non-Final Office Action in connection with U.S. Appl. No. 16/807,564 dated Sep. 22, 2021.
Non-Final Office Action in connection with U.S. Appl. No. 16/807,564 dated Dec. 27, 2021.
Non-Final Office Action dated Sep. 17, 2021 for U.S. Appl. No. 16/940,529.
Final Office Action dated Jan. 21, 2022 for U.S. Appl. No. 16/940,529.
Notice of Allowance dated Mar. 30, 2022 for U.S. Appl. No. 16/940,529.

* cited by examiner 1000
1002
214
202
Fig. 10
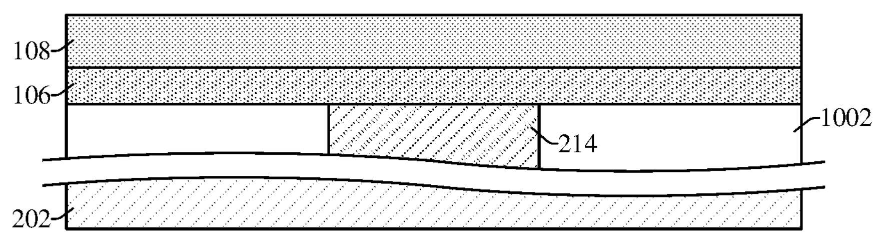
Fig. 11
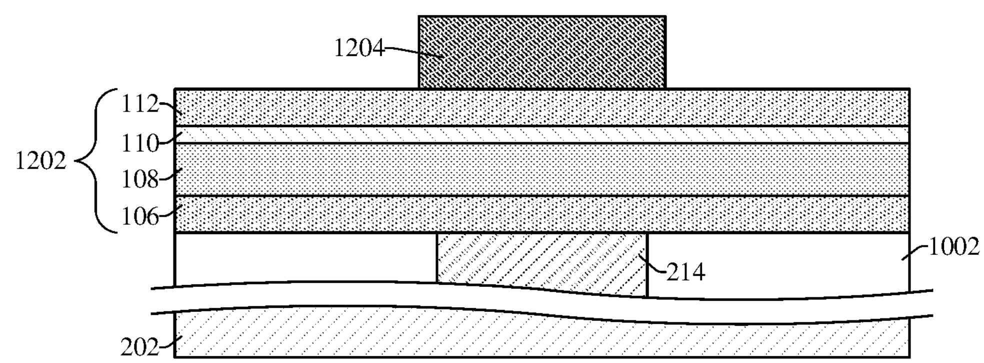
Fig. 12

MULTI-DOPED DATA STORAGE STRUCTURE CONFIGURED TO IMPROVE RESISTIVE MEMORY CELL PERFORMANCE

REFERENCE TO RELATED APPLICATION

This Application is a Divisional of U.S. application Ser. No. 16/940,529, filed on Jul. 28, 2020, the contents of which are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random access memory (RRAM) is one promising candidate for next generation non-volatile memory technology due to its simple structure and compatibility with complementary metal-oxide semiconductor (CMOS) logic processes. An RRAM cell includes a dielectric data storage structure having a variable resistance, which is placed between two conductive structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10-14 illustrate cross-sectional views of some embodiments of a method for forming a memory cell having a data storage structure that is multi-doped with a first dopant, a second dopant, and/or a third dopant.

DETAILED DESCRIPTION

Figure 1:
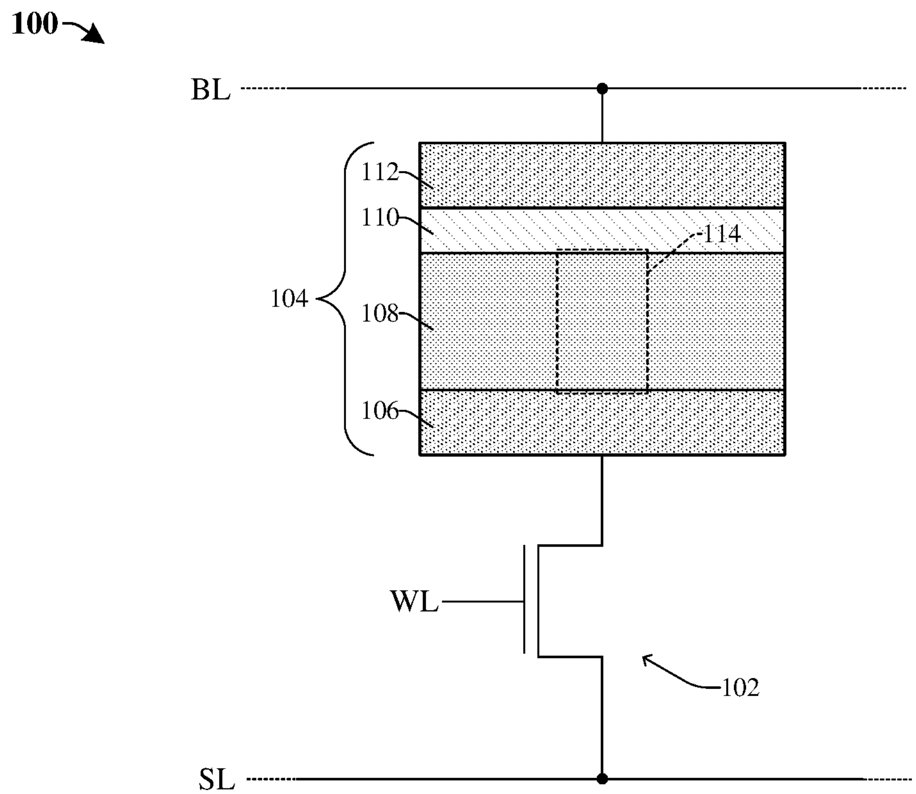
FIG. 1 illustrates a schematic view of some embodiments of a memory device including a memory cell having a low forming voltage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage structure (e.g., one or more oxide layer(s)) arranged between a top electrode and a bottom electrode. The RRAM cell is disposed over a semiconductor substrate. A variable resistance of the data storage structure represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

Before an RRAM cell can be used to store data, an initial conductive path (i.e., conductive filament) is typically formed across the data storage structure. Formation of the initial conductive path makes subsequent write operations (that form the conductive path) easier to perform. To form the initial conductive path, at the end of the RRAM manufacturing process a forming voltage is applied across the top and bottom electrodes. In some types of RRAM cells, the conductive path may include vacancies (e.g., oxygen vacancies). In such devices the forming voltage may knock oxygen atoms out of a lattice of the data storage structure, thereby forming localized oxygen vacancies. These localized oxygen vacancies tend to align to form the conductive path which extends through the data storage structure. Thereafter, set or reset voltages can be applied across the top and bottom electrodes to change resistivity of the data storage structure between the high resistance state and the low resistance state. Generally, the forming voltage is greater than the set voltage. Typically, one or more transistors (e.g., a metal-oxide-semiconductor field-effect transistor (MOSFET)) disposed on/over the semiconductor substrate provide voltages to the RRAM cell, such that the forming voltage, the set voltage, and the reset voltage may be applied across the top electrode and the bottom electrode.

In some embodiments in which the conductive filament is formed before the RRAM cell is used to store data, the data storage structure may be or comprise an undoped metal oxide structure (e.g., undoped aluminum oxide ($AlO_x$)). In such embodiments, the forming voltage may be relatively high. In an effort to improve device density and device performance, feature sizes of the one or more transistors and/or RRAM cell are continually being scaled down. However, as the feature sizes of the one or more transistors are scaled down, the relatively high forming voltage becomes problematic (e.g., due to the reduced feature sizes of the one or more transistors reducing breakdown voltages). The relatively high forming voltage may be greater than a safe output voltage of the one or more transistors. Accordingly, if the one or more transistors are operated to output the relatively high forming voltage, the one or more transistors may be damaged and/or destroyed.

The present application, in some embodiments, is directed toward an RRAM cell that has a low forming voltage. The RRAM cell includes a top electrode, a bottom electrode, and a data storage structure disposed between the top and bottom electrodes. The data storage structure comprises a dielectric material (e.g., aluminum oxide ($AlO_x$)) multi-doped with multiple dopants. For example, the multiple dopants may include a first dopant (e.g., nitrogen), a second dopant (e.g., tantalum), and/or a third dopant (e.g., hafnium). Because the data storage structure is multi-doped with the first dopant, second dopant, and/or third dopant, a forming voltage of the RRAM cell may be improved (e.g., reduced) while maintaining good reliability of the RRAM cell. For example, doping the data storage structure with the first dopant may reduce or eliminate the forming voltage of the RRAM cell, doping the data storage structure with the second dopant may increase or maintain reliability of the RRAM cell (e.g., good retention performance), and doping the data storage structure with the third dopant may reduce a current leakage path of the RRAM cell (e.g., good endurance performance). Accordingly, an integrated chip comprising the RRAM cell may have one or more transistor(s) with scaled down feature sizes that can safely provide the low forming voltage to the RRAM cell. This, in turn, facilitates shrinking the feature sizes of the RRAM cell and the one or more transistor(s) and/or reducing a power consumption of the integrated chip while mitigating damage to the RRAM cell and/or the one or more transistors(s).

FIG. 1 illustrates a schematic view of some embodiments of a memory device 100 including a memory cell 104 having a data storage structure 108 that is multi-doped and has a low forming voltage.

The memory device 100 includes the memory cell 104 electrically coupled to a transistor 102, such that the memory device 100 is in a one transistor-one resistive memory cell (1T1R) configuration. In some embodiments, the transistor 102 may, for example, be a metal-oxide-semiconductor field-effect transistor (MOSFET). The memory cell 104 includes a bottom electrode 106, a top electrode 112, a capping layer 110, and the data storage structure 108 disposed between the bottom and top electrodes 106, 112. In some embodiments, the bottom electrode 106 is referred to as a lower conductive structure and the top electrode 112 is referred to as an upper conductive structure. A bit line (BL) is electrically coupled to one end of the data storage structure 108 through the top electrode 112, and a source line (SL) is electrically coupled to an opposite end of the data storage structure 108 by way of the transistor 102. A word line (WL) is electrically coupled to a gate electrode of the transistor 102. Thus, application of a suitable WL voltage to the gate electrode of the transistor 102 couples the memory cell 104 between the BL and the SL. Consequently, in some embodiments, by providing suitable bias conditions, the memory cell 104 can be switched between two states of electrical resistance, a low resistance state and a high resistance state, to store data.

In some embodiments, the data storage structure 108 comprises a dielectric material (e.g., aluminum oxide ($AlO_x$)) multi-doped with multiple dopants. For example, the multiple dopants may include a first dopant (e.g., nitrogen), a second dopant (e.g., tantalum), and/or a third dopant (e.g., hafnium). In some embodiments, the dielectric material may be a metal oxide. Thus, in various embodiments, the data storage structure 108 may comprise aluminum oxide, nitrogen, tantalum, and hafnium and/or may have a thickness within a range of about 10 to 60 angstroms. In further embodiments, between about 5 to 10 percent of a chemical composition of the data storage structure 108 is the first dopant (e.g., nitrogen). In yet further embodiments, between about 12 to 18 percent of a chemical composition of the data storage structure 108 is the second dopant (e.g., tantalum). In some embodiments, between about 15 to 22 percent of a chemical composition of the data storage structure 108 is the third dopant (e.g., hafnium). In yet further embodiments, the data storage structure 108 may be referred to as a multi-dopant switching layer (MDSL). In some embodiments, the memory cell 104 may be configured as a resistive random access memory (RRAM) cell, such that the data storage structure 108 comprises material(s) having a variable resistance configured to undergo a reversible phase change between a high resistance state and a low resistance state.

In some embodiments, before the memory cell 104 may be used to store data, an initial conductive path (i.e., conductive filament) is typically formed within a region 114 across the data storage structure 108. Formation of the initial conductive path makes subsequent write operations (that form the conductive path) easier to perform. In further embodiments, to formed the initial conductive path, a forming voltage is applied across the top electrode 112 and the bottom electrode 106 by the transistor 102 and the BL. The initial conductive path may include vacancies (e.g., oxygen vacancies). In such embodiments, the forming voltage may knock oxygen atoms out of a lattice of the data storage structure 108, thereby forming localized oxygen vacancies. These localized vacancies tend to align with the region 114 to form the initial conductive path which extends within the data storage structure 108 from the bottom electrode 106 to the capping layer 110. Thereafter, set or reset voltages can be applied across the bottom and top electrodes 106, 112 by way of the transistor 102 and the BL, to change resistivity of the data storage structure 108 between the high resistance state and the low resistance state.

In various embodiments, by virtue of the data storage structure 108 comprising the first dopant (e.g., nitrogen), the forming voltage may be reduced and/or eliminated. For example, in some embodiments, formation of the initial conductive path may not be performed before a set operation is performed on the memory cell 104, such that a forming voltage is not applied across the data storage structure 108 and/or the transistor 102. This in turn facilitates shrinking the feature sizes of the memory cell 104 and/or the transistor 102 while mitigating damage to the memory cell 104 and/or the transistor 102. In some embodiments, the forming voltage may be equal to a set voltage. In further embodiments, by virtue of the data storage structure 108 comprising the second dopant (e.g., tantalum), data retention of the memory cell 104 may be improved. In such embodiments, the second dopant has a strong bond with oxygen atoms within the data storage structure 108, such that heat applied to the data storage structure 108 during formation and/or operation of the data storage structure 108 may not break the strong bond between the second dopant and oxygen atoms. In various embodiments, by virtue of the data storage structure 108 comprising the first dopant (e.g., nitrogen) and the second dopant (e.g., tantalum), the data retention of the memory cell 104 may be future improved. In yet further embodiments, by virtue of the data storage structure 108 comprising the third dopant (e.g., hafnium), endurance of the memory cell 104 may be improved. In such embodiments, the third dopant is configured to reduce a current leakage path in the RRAM cell. In various embodiments, by virtue of the data storage structure 108 comprising the first dopant (e.g., nitrogen) and the third dopant (e.g., hafnium), the current leakage path in the memory cell 104 is further decreased. Thus, because the data storage structure 108 is multi-doped with the first dopant, second dopant, and/or third dopant, the forming voltage of the memory cell 104 may be improved (e.g., reduced or eliminated) while maintaining good data retention and good endurance of the memory cell 104.

Figure 2:
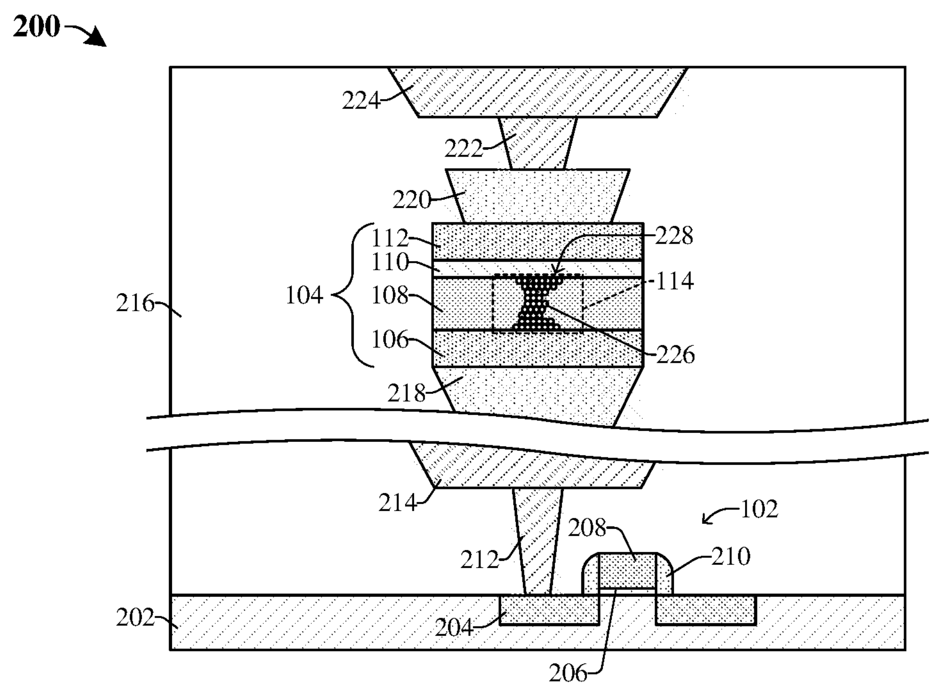
FIG. 2 illustrates a cross-sectional view of some embodiments of a memory device including a memory cell having a multi-doped data storage structure.

FIG. 2 illustrates a cross-sectional view of some embodiments of a memory device 200 including the memory cell 104 having the data storage structure 108 that comprises the first dopant, the second dopant, and/or the third dopant.

In some embodiments, the memory device 200 includes an interconnect dielectric structure 216 and a substrate 202. In some embodiments, the substrate 202 may, for example, be or comprise a semiconductor body such as monocrystalline silicon/CMOS bulk, silicon-germanium (SiGe), a silicon-on-insulator (SOI), or another suitable semiconductor substrate material and/or the substrate 202 may comprise a first doping type (e.g., p-type). The transistor 102 is disposed over/within the substrate 202. In some embodiments, the transistor 102 may, for example, be or comprise a metal oxide semiconductor field effect transistor (MOSET), a high voltage transistor, a bipolar junction transistor (BTJ), an n-channel metal oxide semiconductor (nMOS) transistor, a p-channel metal oxide semiconductor (pMOS) transistor, or another suitable transistor. It will be appreciated that the transistor 102 being configured as another semiconductor device is also within the scope of the disclosure. In further embodiments, the transistor 102 may, for example, be configured as a gate-all-around FET (GAAFET), a gate-surrounding FET, a multi-bridge channel FET (MBCFET), a nanowire FET, a nanoring FET, a nanosheet field-effect transistor (NSFET), or the like. In further embodiments, the transistor 102 may include source/drain regions 204, a gate dielectric layer 206, a gate electrode 208, and/or a sidewall spacer structure 210. The source/drain regions 204 may be disposed within the substrate 202 and/or may comprise a second doping type (e.g., n-type) opposite the first doping type.

A lower interconnect via 212 is disposed within the interconnect dielectric structure 216 and overlies a source/drain region 204 of the transistor 102. In some embodiments, the interconnect dielectric structure 216 may, for example, be or comprise one or more inter-level dielectric (ILD) layers. The one or more ILD layers may, for example, respectively be or comprise silicon oxide, a low-κ dielectric material, an extreme low-κ dielectric material, another suitable dielectric material, or any combination of the foregoing. As used herein, a low-κ dielectric material may be or comprise, for example, a dielectric material with a dielectric constant less than about 3.9, 3, 2, or 1.5. A lower interconnect wire 214 overlies the lower interconnect via 212. In some embodiments, the lower interconnect via and wire 212, 214 may, for example, respectively be or comprise copper, aluminum, tungsten, ruthenium, titanium nitride, tantalum nitride, ruthenium, another conductive material, or any combination of the foregoing. A bottom electrode via 218 is disposed within the interconnect dielectric structure 216 and overlies the lower interconnect wire 214. A top electrode via 220 overlies the bottom electrode via 218. The memory cell 104 is disposed within the interconnect dielectric structure 216 between the bottom electrode via 218 and the top electrode via 220. An upper interconnect via 222 is disposed over the top electrode via 220, and an upper interconnect wire 224 overlies the upper interconnect via 222.

In some embodiments, the memory cell 104 includes the bottom electrode 106, the capping layer 110, the top electrode 112, and the data storage structure 108 disposed between the bottom and top electrodes 106, 112. During operation, the memory cell 104 relies on redox reactions to form and dissolve a conductive path 228 in a region 114 of the data storage structure 108 between the bottom electrode 106 and the capping layer 110. The existence of the conductive path 228 in the region 114 between the bottom electrode 106 and the capping layer 110 produces a low resistance state, while the absence of the conductive path 228 in the region 114 results in a high resistance state. Thus, the memory cell 104 can be switched between the high resistance state and the low resistance state by applying appropriate biases to the memory cell 104 to produce or dissolve the conductive path 228 in the region 114. In further embodiments, the conductive path 228 may, for example, include oxygen vacancies 226 disposed within the region 114 and extending between the bottom electrode 106 and the capping layer 110.

In some embodiments, the data storage structure 108 may comprise a multi-doped dielectric material, such that the data storage structure 108 includes a dielectric material, a first dopant, a second dopant, and a third dopant. In some embodiments, the dielectric material may, for example, be or comprise a high-κ dielectric material, aluminum oxide (e.g., $Al_2O_3$), tantalum oxide (e.g., $Ta_2O_5$), hafnium oxide (e.g., $HfO_2$), another dielectric material, or any combination of the foregoing. As used herein, a high-κ dielectric material may, for example, be or comprise a dielectric material with a dielectric constant greater than approximately 3.9, 9.34, 9.9, or 11.54. In some embodiments, the first dopant may, for example, be or comprise nitrogen, silicon, fluorine, or the like. It will be appreciated that the first dopant comprising other elements is also within the scope of the disclosure. In further embodiments, the second dopant may, for example, be or comprise tantalum, cerium, or the like. It will be appreciated that the second dopant comprising other elements is also within the scope of the disclosure. In yet further embodiments, the third dopant may, for example, be or comprise hafnium, zirconium, or the like. It will be appreciated that the third dopant comprising other elements is also within the scope of the disclosure. Thus, in some embodiments, the data storage structure 108 may, for example, be or comprise aluminum oxide (e.g., $Al_2O_3$) doped with the first dopant, the second dopant, and the third dopant, where the first, second, and third dopants are each different from one another. In various embodiments, the first dopant may be configured to reduce a forming voltage of the data storage structure 108, the second dopant may be configured to increase data retention of the data storage structure 108, and the third dopant is configured to increase endurance of the data storage structure 108, thereby increasing a performance of the memory device 200.

In various embodiments, between about 5 to 10 percent of a chemical composition of the data storage structure 108 is the first dopant (e.g., nitrogen, silicon, fluorine, etc.). It will be appreciated that the data storage structure 108 comprising other chemical composition percentages of the first dopant is also within the scope of the disclosure. In some embodiments, if the first dopant is a relatively small percent (e.g., less than about 5 percent) of the chemical composition of the data storage structure 108, then the forming voltage of the memory cell 104 may not be reduced. In further embodiments, if the first dopant is a relatively large percent (e.g., greater than about 10 percent) of the chemical composition of the data storage structure 108, then an endurance of the memory cell 104 may be reduced, thereby decreasing a number of set and/or reset operations that may be performed on the data storage structure 108.

Further, in some embodiments, between about 12 to 18 percent of the chemical composition of the data storage structure 108 is the second dopant (e.g., tantalum, cerium, etc.). It will be appreciated that the data storage structure 108 comprising other chemical composition percentages of the second dopant is also within the scope of the disclosure. In some embodiments, if the second dopant is a relatively small percent (e.g., less than about 12 percent) of the chemical composition of the data storage structure 108, then data retention of the memory cell 104 may not be increased. In further embodiments, if the second dopant is a relatively large percent (e.g., greater than about 18 percent) of the chemical composition of the data storage structure 108, then a number of set and/or reset operations that may be performed on the data storage structure 108 is reduced.

In further embodiments, between about 15 to 22 percent of the chemical composition of the data storage structure 108 is the third dopant (e.g., hafnium, zirconium, etc.). It will be appreciated that the data storage structure 108 comprising other chemical composition percentages of the third dopant is also within the scope of the disclosure. In some embodiments, if the third dopant is a relatively small percent (e.g., less than about 15 percent) of the chemical composition of the data storage structure 108, then the endurance of the memory cell 104 may not be increased. In further embodiments, if the third dopant is a relatively large percent (e.g., greater than about 22 percent) of the chemical composition of the data storage structure 108, then the forming voltage of the data storage structure 108 may be increased.

Furthermore, in various embodiments, between about 7 to 15 percent of the chemical composition of the data storage structure 108 is aluminum. It will be appreciated that the data storage structure 108 comprising other chemical composition percentages of aluminum is also within the scope of the disclosure. In some embodiments, between about 38 to 48 percent of the chemical composition of the data storage structure 108 is oxygen. It will be appreciated that the data storage structure 108 comprising other chemical composition percentages of oxygen is also within the scope of the disclosure. In some embodiments, the data storage structure 108 comprises a first atomic percentage of the first dopant, a second atomic percentage of the second dopant, a third atomic percentage of the third dopant, a fourth atomic percentage of aluminum, and a fifth atomic percentage of oxygen. In further embodiments, the first atomic percentage is less than the second atomic percentage and the second atomic percentage is less than the third atomic percentage. In yet further embodiments, the first atomic percentage may be within a range of about 5 to 10 percent, the second atomic percentage may be within a range of about 12 to 18 percent, the third atomic percentage may be within a range of about 15 to 22 percent, the fourth atomic percentage may be within a range of about 7 to 15 percent, and/or the fifth atomic percentage may be within a range of about 38 to 48 percent. It will be appreciated that the first through fifth atomic percentages respectively comprising other values is within the scope of the disclosure. In various embodiments, a thickness of the data storage structure 108 is within a range of about 10 to 60 angstroms. It will be appreciated that the thickness of the data storage structure 108 having other values is within the scope of the disclosure. In further embodiments, if the thickness of the data storage structure 108 is relatively small (e.g., less than about 10 angstroms), then high current leakage may occur between the bottom electrode 106 and the capping layer 110. In yet further embodiments, if the thickness of the data storage structure 108 is relatively large (e.g., greater than about 60 angstroms), then the forming voltage of the memory cell 104 may be increased. In various embodiments, the data storage structure 108 may, for example, consist of or consist essentially of a compound of the dielectric material, the first dopant, and the second dopant (e.g., AlTaON); a compound of the dielectric material, the first dopant, and the third dopant (e.g., AlHfON); a compound of the dielectric material, the first dopant, the second dopant, and the third dopant (e.g., AlTaHfON); or another suitable material.

In some embodiments the bottom and/or top electrode vias 218, 220 may, for example, respectively be or comprise copper, aluminum, tungsten, another suitable conductive material, or any combination of the foregoing. In some embodiments, the capping layer 110 may, for example, be or comprise tantalum, titanium, tantalum nitride, titanium nitride, any combination of the foregoing, or the like. In further embodiments, the bottom and/or top electrodes 106, 112 may, for example, respectively be or comprise titanium nitride, tantalum nitride, tantalum, titanium, platinum, nickel, hafnium, zirconium, ruthenium, iridium, another conductive material, or any combination of the foregoing. Thus, in some embodiments, the capping layer 110 may comprise the first dopant (e.g., nitrogen) and/or the second dopant (e.g., tantalum). In further embodiments, the top and bottom electrodes 106, 112 may respectively comprise the first dopant (e.g., nitrogen), the second dopant (e.g., tantalum), and/or the third dopant (e.g., hafnium).

Figure 5:
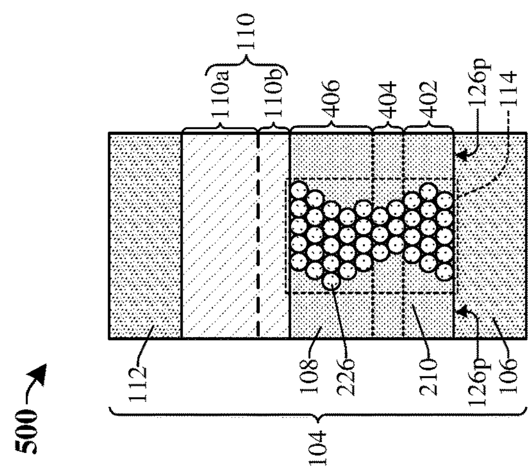
FIGS. 3-5 illustrate cross-sectional views of some embodiments of operating a memory cell including a multi-doped data storage structure.
Figure 4:
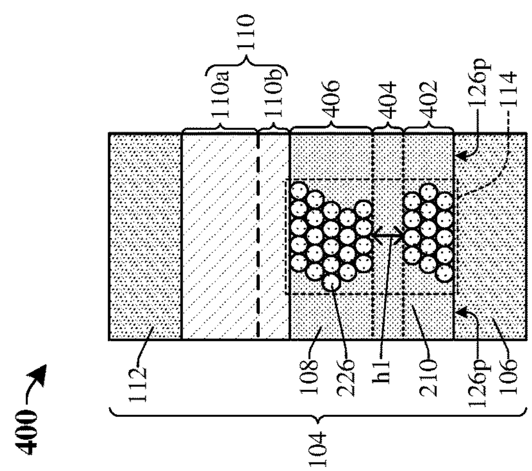
Figure 3:
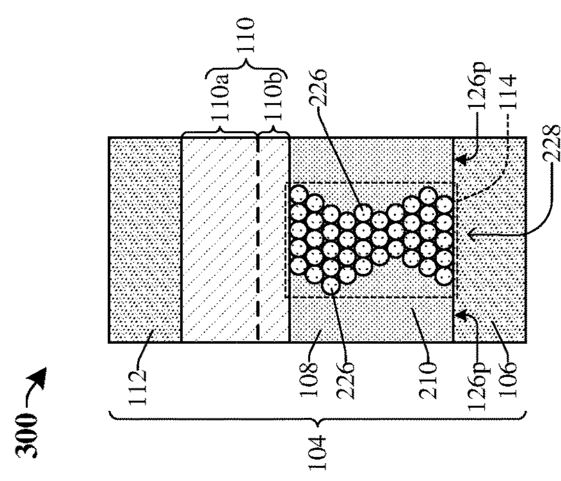

FIGS. 3-5 illustrate cross-sectional views of some embodiments of different states of the memory cell 104 of FIGS. 1 and/or 2 during operation of the memory cell 104. In some embodiments, FIG. 3 illustrates a first state 300, in which the memory cell 104 is in a low resistance state (e.g., storing a logical "1"). In further embodiments, FIG. 4 illustrates a second state 400, in which the memory cell 104 is in a high resistance state (e.g., storing a logical "0"). In yet further embodiments, FIG. 5 illustrates a third state 500, in which the memory cell 104 is in a low resistance state (e.g., storing a logical "1").

Although FIGS. 3-5 describe a memory cell as having a conductive path formed of oxygen vacancies, it will be appreciated that the disclosed data storage structure is not limited to a memory cell having such paths. For example, in some embodiments, the data storage structure may be used in memory devices having a conductive path that is formed of conductive ions and oxygen vacancies or formed of conductive ions and not oxygen vacancies.

FIG. 3 illustrates one embodiment of the first state 300 of the memory cell 104, in which a forming operation was performed on the memory cell 104. The memory cell 104 includes the data storage structure 108, the bottom electrode 106, the top electrode 112, and the capping layer 110 (e.g., as illustrated and described in FIGS. 1 and/or 2). In some embodiments, the capping layer 110 may include a metal layer **110*a* (e.g., comprising a metal material such as tantalum, tantalum nitride, titanium, titanium nitride, or the like) overlying a metal oxide layer 110*b* (e.g., comprising an oxide of the metal material). In some embodiments, during the forming operation, a forming voltage is applied across the bottom and top electrode 106, 112. In such embodiments, the forming voltage is configured to knock oxygen atoms out of a lattice of the data storage structure 108, and the metal oxide layer 110*b* is configured to receive the oxygen atoms, thereby forming oxygen vacancies 226 in the data storage structure 108. The oxygen vacancies 226 tend to align within a region 114 of the data storage structure 108 to form a conductive path 228 (e.g., an initial conductive path) which extends through the data storage structure 108. In some embodiments, the oxygen vacancies 226 are offset from a peripheral region 126*p* of the data storage structure 108, where the peripheral region 126*p* laterally encloses the region 114. Thus, after the forming operation, the memory cell 104 is in a low resistance state (e.g., storing a logical "1"). In some embodiments, by virtue of the data storage structure 108 comprising the first dopant (e.g., nitrogen), the forming voltage may be reduced and/or eliminated. For example, in some embodiments, the forming voltage may be approximately equal to a set voltage (e.g., see FIG. 5) of the memory cell 104, such that the formation process is eliminated and a set operation is performed on the memory cell 104 to achieve the first state 300. This in turn facilitates shrinking feature sizes of the memory cell 104 while mitigating damage to the memory cell 104**.

FIG. 4 illustrates one embodiment of the second state 400 of the memory cell 104, in which a reset operation was performed on the memory cell 104. In some embodiments, during the reset operation, a reset voltage is applied across the bottom and top electrodes 106, 112. In such embodiments, the reset voltage is configured to knock oxygen atoms from the metal oxide layer **110*b* to a middle region 404 of the data storage structure 108, thereby dissolving at least a portion of the conductive path (228 of FIG. 3) such that the memory cell 104 is in a high resistance state (e.g., storing a logical "0"). In further embodiments, the data storage structure 108 comprises a lower region 402, an upper region 406, and the middle region 404 disposed vertically between the lower and upper regions 402, 406. In various embodiments, after performing the reset operation, oxygen vacancies 226 may remain in the lower and upper regions 402, 406, and at least a majority of the oxygen vacancies 226 may be removed from the middle region 404. By virtue of the data storage structure 108 comprising the first dopant (e.g., nitrogen), the second dopant (e.g., tantalum), and/or the third dopant (e.g., hafnium), a height h1 of the middle region 404 may be reduced, thereby reducing the set and/or reset voltages and increasing a switching efficiency of the memory cell 104. In further embodiments, the third dopant (e.g., hafnium) is configured to reduce current leakage paths in the data storage structure 108 while in the high resistance state, thereby increasing discrete data states and an endurance of the memory cell 104. For example, the third dopant can increase an energy level of the oxygen vacancies within the data storage structure 108 such that oxygen atoms may more easily recombine in the data storage structure 108 during the reset operation, thereby decreasing current leakage paths in the memory cell 104** while in the high resistance state.

FIG. 5 illustrates one embodiments of the third state 500 of the memory cell 104, in which a set operation was performed on the memory cell 104. In some embodiments, during the set operation, a set voltage is applied across the bottom and top electrodes 106, 112. In further embodiments, the set voltage is configured to knock oxygen atoms from the middle region 404 of the data storage structure 108 to the metal oxide layer **110*b*, thereby forming the conductive path 228 in the region 114 of the data storage structure. Thus, the memory cell 104 is in the low resistance state (e.g., storing a logical "1"). By virtue of the data storage structure 108 comprising the first dopant, second dopant, and/or third dopant, data retention and the switching efficiency of the memory cell 104** may be improved.

In some embodiments, by virtue of the data storage structure 108 comprising the first dopant (e.g., nitrogen) and the second dopant (e.g., tantalum), an energy used to complete the forming operation of FIG. 3 is significantly reduced such that the forming voltage is substantially equal to the set voltage. In such embodiments, the forming operation may be omitted and the set operation may be performed in place of the forming operation. In yet further embodiments, the forming voltage may be within a range of about 0 to 25 percent greater than the set voltage. In some embodiments, if the set voltage is about 2 volts (V), then the forming voltage is less than about 2.5 V. In some embodiments, the first dopant (e.g., nitrogen) may, for example, decrease energy required to form the oxygen vacancies 226 within the data storage structure 108, thereby increasing an ability to form localized oxygen vacancies within the region 114. In further embodiments, by virtue of the data storage structure 108 comprising the second dopant (e.g., tantalum), data retention of the memory cell 104 may be improved. In such embodiments, the second dopant has a strong bond with oxygen atoms within the data storage structure 108, such that the strong bond may not be broken by high heat (e.g., greater than about 250 degrees Celsius) applied to the memory cell 104 during formation and/or operation of the memory cell 104. In some embodiments, the strong bond between the second dopant and the oxygen atoms may be greater than about 600 kilojoules per mole (kJ/mol). For example, if the second dopant is tantalum, then the strong bond between tantalum and oxygen may be within a range of about 800 to 845 kJ/mol. In further embodiments, the strong bond between the second dopant (e.g., tantalum) and oxygen is greater than a bond between the first dopant (e.g., nitrogen) and oxygen, and the bond between the first dopant and oxygen is greater than a bond between aluminum and oxygen. In some embodiments, the strong bond between the second dopant and oxygen is greater than a bond between the third dopant (e.g., hafnium) and oxygen. For example, the bond between the third dopant and oxygen may be within a range of about 550 to 700 kJ/mol. Thus, because the data storage structure 108 is multi-doped with the first, second, and third dopants, the forming voltage of the memory cell 104 may be improved (e.g., reduced or eliminated) while maintaining good data retention of the memory cell 104 and increasing a switching performance of the memory cell 104.

Figure 6:
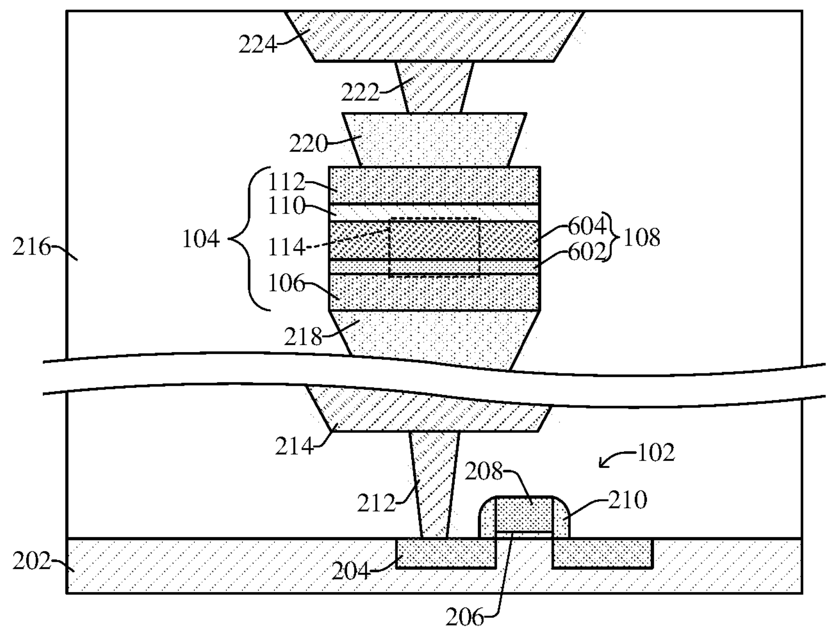
FIGS. 6 and 7 illustrate cross-sectional views of some alternative embodiments of the memory device of FIG. 2.

FIG. 6 illustrates a cross-sectional view of some embodiments of a memory device 600 that corresponds to some alternative embodiments of the memory device 200 of FIG. 2, where the data storage structure 108 comprises a data storage layer 604 overlying a multi-doped data storage layer 602. Further, the conductive path (e.g., the conductive path 228 of FIG. 2) may be selectively produced or dissolved within the region 114, where the region 114 continuously extends across the multi-doped data storage layer 602 and the data storage layer 604. In some embodiments, the data storage layer 604 may, for example, be or comprise undoped hafnium oxide, undoped tantalum oxide, another dielectric material, or any combination of the foregoing. In yet further embodiments, the multi-doped data storage layer 602 comprises a dielectric material (e.g., aluminum oxide ($AlO_x$)) multi-doped with multiple dopants. For example, the multiple dopants may include a first dopant (e.g., nitrogen), a second dopant (e.g., tantalum), and a third dopant (e.g., hafnium). In various embodiments, the multi-doped data storage layer 602 may, for example, be or comprise a compound of the dielectric material, the first dopant, and the second dopant (e.g., AlTaON); a compound of the dielectric material, the first dopant, and the third dopant (e.g., AlHfON); a compound of the dielectric material, the first dopant, the second dopant, and the third dopant (e.g., AlTaHfON); or another suitable material. Thus, in some embodiments, the multi-doped data storage layer 602 may comprise a same chemical composition and/or multi-doped material as described in relation to the data storage structure 108 of FIGS. 1 and/or 2. In yet further embodiments, the data storage layer 604 may, for example, be or comprise undoped hafnium oxide, undoped tantalum oxide, another dielectric material, or any combination of the foregoing. In some embodiments, the data storage layer 604 may be devoid of the first dopant (e.g., nitrogen).

Figure 7:
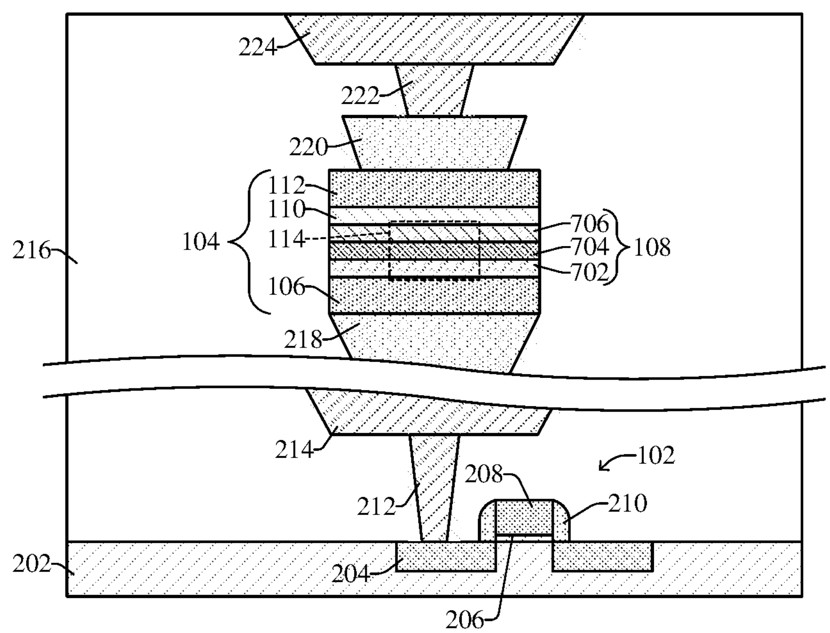

FIG. 7 illustrates a cross-sectional view of some embodiments of a memory device 700 that corresponds to some alternative embodiments of the memory device 200 of FIG. 2, where the data storage structure 108 comprises a first data storage layer 702, a second data storage layer 704, and a third data storage layer 706. In some embodiments, the first data storage layer 702 comprises a first dielectric material (e.g., aluminum oxide) doped with the first dopant (e.g., nitrogen), the second data storage layer 704 comprises a second dielectric material (e.g., hafnium oxide) doped with the first dopant, and/or the third data storage layer 706 comprises a third dielectric material (e.g., tantalum oxide) doped with the first dopant. In further embodiments, the first, second, and third dielectric materials each comprise a high-κ dielectric material (e.g., aluminum oxide, hafnium oxide, tantalum oxide, etc.) different from one another.

Figure 8:
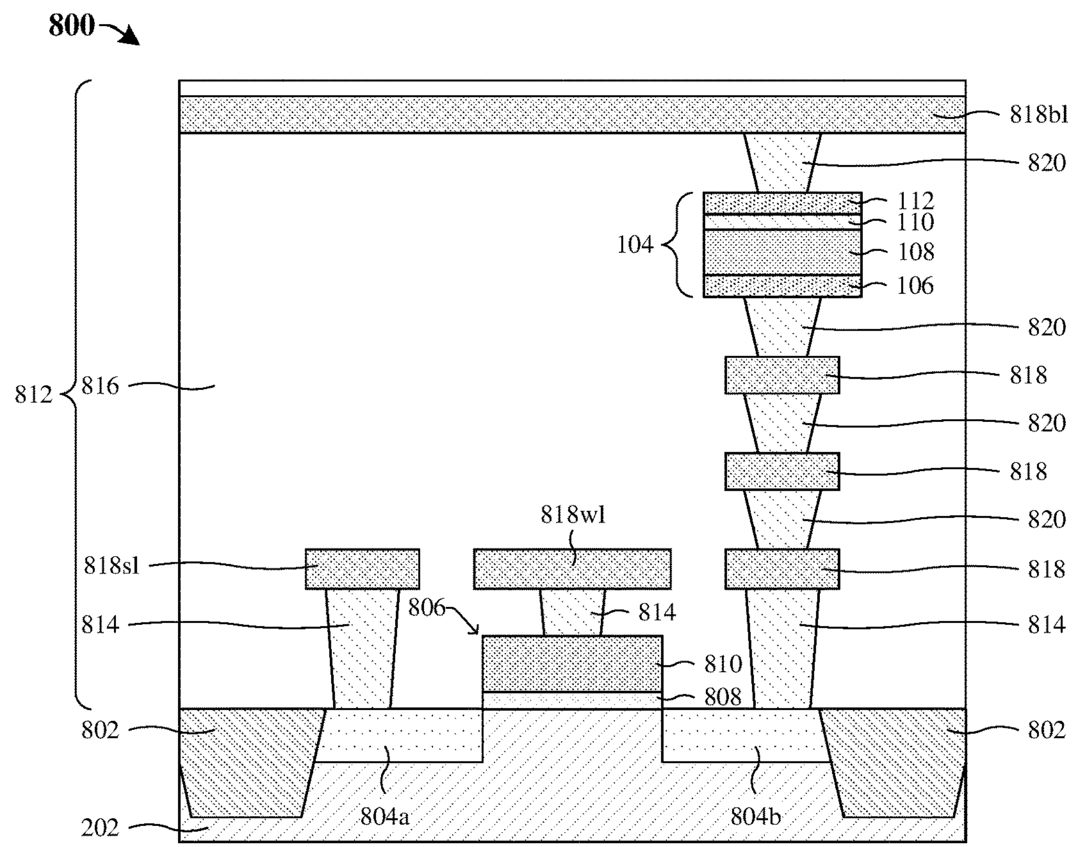
FIGS. 8 and 9 illustrate cross-sectional views of some embodiments of an integrated chip having a memory cell disposed over a substrate, where the memory cell has a low forming voltage.

FIG. 8 illustrates a cross-sectional view of some embodiments of an integrated chip 800 having a memory cell 104 disposed within an interconnect structure 812 that overlies a substrate 202. In some embodiments, the memory cell 104 of FIG. 8 is configured as the memory cell 104 of FIG. 1, 2, 6, or 7. It will be appreciated that, in some embodiments, the integrated chip 800 may comprise a plurality of the memory cells 104 disposed in a memory array.

The integrated chip 800 includes a semiconductor device 806 disposed on the substrate 202. In some embodiments, the semiconductor device 806 may be a metal-oxide semiconductor field-effect transistor (MOSFET), a bipolar junction transistor (BTJ), a high-electric-mobility transistor (HEMT), or any other front-end-of-line semiconductor device. In further embodiments, the semiconductor device 806 may comprise a gate dielectric layer 808, a gate electrode 810 overlying the gate dielectric layer 808, and a pair of source/drain regions 804*a-b*. An isolation structure 802 is disposed within the substrate 202 and is configured to electrically isolate the semiconductor device 806 from other devices (not shown) disposed within and/or on the substrate 202.

An interconnect structure 812 is disposed over the substrate 202 and the semiconductor device 806. In some embodiments, the interconnect structure 812 comprises an interconnect dielectric structure 816, a plurality of conductive contacts 814, a plurality of conductive lines 818 (e.g., metal lines), and a plurality of conductive vias 820 (e.g., metal vias). The plurality of conductive contacts 814, the plurality of conductive lines 818, and the plurality of conductive vias 820 are electrically coupled in a predefined manner and configured to provide electrical connections between various devices disposed throughout the integrated chip 800. In further embodiments, the plurality of conductive contacts 814, the plurality of conductive lines 818, and/or the plurality of conductive vias 820 may, for example, respectively be or comprise titanium nitride, tantalum nitride, tungsten, ruthenium, aluminum, copper, another conductive material, or any combination of the foregoing. In yet further embodiments, the interconnect dielectric structure 816 may comprises one or more ILD layers, which may respectively comprise a low-κ dielectric material, an oxide (e.g., silicon dioxide), another dielectric material, or any combination of the foregoing. In further embodiments, the memory cell 104 is disposed in an upper region of the interconnect structure 812, such that the memory cell 104 is vertically above the plurality of conductive contacts 814 and/or vertically above one or more layers of the conductive lines 818 and the conductive vias 820. The memory cell 104 comprises the bottom electrode 106, the data storage structure 108 that is multi-doped with multiple dopants, the capping layer 110, and the top electrode 112.

A first one of the plurality of conductive lines 818 is denoted as 818*wl* and may be referred to as a word line. In some embodiments, the word line 818*wl* may be electrically coupled to the gate electrode 810 of the semiconductor device 806 via the interconnect structure 812. A second one of the plurality of conductive lines 818 is denoted as 818*sl* and may be referred to as a source line. In further embodiments, the source line 818*sl* may be electrically coupled to a first source/drain region 804*a* of the semiconductor device 806 via the interconnect structure 812. A third one of the plurality of conductive lines 818 is denoted as 818*bl* and may be referred to as a bit line. In yet further embodiments, the bit line 818*bl* may be electrically coupled to the top electrode 112 of the memory cell 104 and the bottom electrode 106 may be electrically coupled to a second source/drain region 804*b* of the semiconductor device 806 via the interconnect structure 812.

In some embodiments, the memory cell 104 is electrically coupled to a second source/drain region 804*b* of the semiconductor device 806 via the interconnect structure 812. Thus, in some embodiments, application of a suitable word line voltage to the word line 818*wl* may electrically couple the memory cell 104 between the bit line 818*bl* and the source line 818*sl*. Consequently, by providing suitable bias conditions, the memory cell 104 can be switched between two data states.

Figure 9:
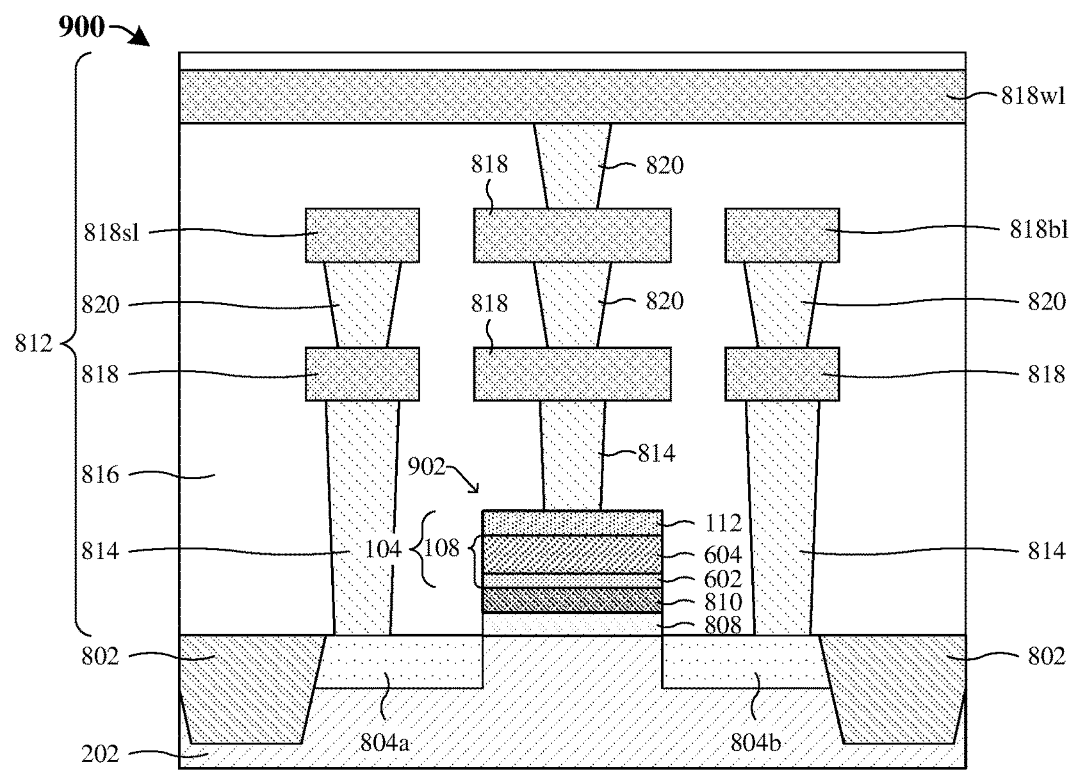

FIG. 9 illustrates a cross-sectional view of some embodiments of an integrated chip 800 having a device gate stack 902 overlying a substrate 202. In some embodiments, the device gate stack 902 comprises the memory cell 104, such that the memory cell 104 of FIG. 9 may be referred to as a front-end-of-line resistive memory cell.

The device gate stack 902 is disposed over the substrate 202 and is spaced laterally between the pair of source/drain regions 804*a-b*. In some embodiments, the device gate stack 902 includes a gate dielectric layer 808, a gate electrode 810, the data storage structure 108, and the top electrode 112. Thus, in various embodiments, the device gate stack 902 may include the memory cell 104 directly overlying the gate electrode 810. In some embodiments, the gate electrode 810 may be referred to as a bottom electrode. In some embodiments, the memory cell 104 comprises the top electrode 112 and the data storage structure 108, where the data storage structure 108 comprises the multi-doped data storage layer 602 and the data storage layer 604. In yet further embodiments, the memory cell 104 of FIG. 9 is configured as the memory cell 104 of FIG. 1, 2, 6, or 7. In yet further embodiments, the capping layer (110 of FIG. 1) is disposed between the top electrode 112 and the data storage structure 108 (not shown). In some embodiments, the word line 818*wl* may be electrically coupled to the data storage structure 108 via the interconnect structure 812. Thus, by providing suitable bias conditions to the word line 818*wl*, the bit line 818*bl*, and/or the source line 818*sl*, the data storage structure 108 can be switched between two data states.

In some embodiments, the gate dielectric layer 808 may, for example, be or comprise a high-κ dielectric material, an oxide (e.g., silicon dioxide), another dielectric material, or any combination of the foregoing and/or may have a thickness within a range of about 1,000 to 1,100 angstroms, or another suitable thickness value. In further embodiments, the gate electrode 810 may, for example, be or comprise ruthenium, aluminum, titanium nitride, tantalum nitride, another conductive material, or any combination of the foregoing and/or may have a thickness within a range of about 150 to 250 angstroms, or another suitable thickness value. In yet further embodiments, the multi-doped data storage layer 602 may, for example, be or comprise a dielectric material (e.g., aluminum oxide) multi-doped with the first dopant (e.g., nitrogen), the second dopant (e.g., tantalum), and the third dopant (e.g., hafnium) and/or may have a thickness of about 13 angstroms, a thickness within a range of about 10 to 15 angstroms, or another suitable thickness value. In various embodiments, the data storage layer 604 may, for example, be or comprise hafnium oxide, tantalum oxide, hafnium and tantalum oxide, another high-κ dielectric material, or any combination of the foregoing and/or may have a thickness of about 30 angstroms, a thickness within a range of about 20 to 40 angstroms, or another suitable thickness value. In some embodiments, the multi-doped data storage layer 602 may comprise $Al_{0.10}Ta_{0.17}Hf_{0.20}O_{0.46}N_{0.06}$, such that an atomic percentage of aluminum is about 10%, an atomic percentage of oxygen is about 46%, an atomic percentage of the first dopant (e.g., nitrogen) is about 6%, an atomic percentage of the second dopant (e.g., tantalum) is about 17%, and an atomic percentage of the third dopant (e.g., hafnium) is about 20%. It will be appreciated that the multi-doped data storage layer 602 comprising other atomic percentages of the aforementioned elements and/or dopants is also within the scope of the disclosure.

The isolation structure 802 may be configured as a shallow trench isolation (STI) structure or another suitable isolation structure. In further embodiments, the isolation structure 802 may, for example, be or comprise silicon dioxide, silicon nitride, silicon carbide, another dielectric material, or any combination of the foregoing. In some embodiments, the substrate 202 comprises a first doping type (e.g., p-type) and the pair of source/drain regions 804*a*-*b* comprise a second doping type (e.g., n-type) that is opposite the first doping type.

FIGS. 10-14 illustrate cross-sectional views 1000-1400 of some embodiments of a method for forming a memory cell having a data storage structure that is multi-doped with a first dopant, a second dopant, and/or a third dopant according to the present disclosure. Although the cross-sectional views 1000-1400 shown in FIGS. 10-14 are described with reference to a method, it will be appreciated that the structures shown in FIGS. 10-14 are not limited to the method but rather may stand alone separate of the method. Although FIGS. 10-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As shown in cross-sectional view 1000 of FIG. 10, a lower inter-level dielectric (ILD) layer 1002 is formed over a substrate 202, and a lower interconnect wire 214 is formed within the lower ILD layer 1002. In some embodiments, the lower ILD layer 1002 may, for example, be deposited by chemical vapor deposition (CVD), physical vapor deposition (PVD), atomic layer deposition (ALD), or another suitable deposition or growth process. In further embodiments, the lower interconnect wire 214 may be formed by a single damascene process, a dual damascene process, or another suitable formation process. In some embodiments, the substrate 202 may, for example, be or comprise a semiconductor body such as monocrystalline silicon/CMOS bulk, silicon-germanium (SiGe), a silicon-on-insulator (SOI), or another suitable semiconductor substrate material and/or the substrate 202 may comprise a first doping type (e.g., p-type). In various embodiments, the lower interconnect wire 214 may, for example, be or comprise aluminum, copper, ruthenium, titanium nitride, tantalum nitride, another conductive material, or any combination of the foregoing. In some embodiments, the lower ILD layer 1002 may, for example, be or comprise a low-κ dielectric material, an oxide (e.g., silicon dioxide), another suitable dielectric material, or any combination of the foregoing.

As shown in cross-sectional view 1100 of FIG. 11, a bottom electrode 106 is formed over the lower interconnect wire 214 and a data storage structure 108 is formed over the bottom electrode 106. In some embodiments, the bottom electrode 106 and/or the data storage structure 108 may respectively be formed by, for example, CVD, PVD, ALD, sputtering, co-sputtering, electroless plating, electroplating, or another suitable growth or deposition process.

In some embodiments, the data storage structure 108 is formed in such a manner that the data storage structure 108 comprises a dielectric material (e.g., aluminum oxide (e.g., $Al_2O_3$)) multi-doped with a first dopant (e.g., nitrogen), a second dopant (e.g., tantalum), and/or a third dopant (e.g., hafnium). In some embodiments, the dielectric material may, for example, be or comprise a high-κ dielectric material, aluminum oxide (e.g., $Al_2O_3$), tantalum oxide, hafnium oxide, another suitable dielectric material, or any combination of the foregoing. In some embodiments, the first dopant may, for example, be or comprise nitrogen, silicon, fluorine, or the like. In further embodiments, the second dopant may, for example, be or comprise tantalum, cerium, or the like. In yet further embodiments, the third dopant may, for example, be or comprise hafnium, zirconium, or the like. Further, the data storage structure 108 may, for example, be formed such that the data storage structure 108 comprises a first atomic percentage of the first dopant, a second atomic percentage of the second dopant, a third atomic percentage of the third dopant, a fourth atomic percentage of aluminum, and a fifth atomic percentage of oxygen. In yet further embodiments, the first atomic percentage may be within a range of about 5 to 10 percent, the second atomic percentage may be within a range of about 12 to 18 percent, the third atomic percentage may be within a range of about 15 to 22 percent, the fourth atomic percentage may be within a range of about 7 to 15 percent, and/or the fifth atomic percentage may be within a range of about 38 to 48 percent.

Furthermore, a process for forming the data storage structure 108 may include depositing a compound (e.g., the compound comprises the dielectric material (e.g., aluminum oxide), the second dopant (e.g., tantalum), and the third dopant (e.g., hafnium)) by a deposition process (e.g., CVD, PVD, ALD, sputtering, co-sputtering, etc.)) while concurrently exposing the compound to the first dopant (e.g., nitrogen) such that the data storage structure 108 comprises a multi-doped dielectric material (e.g., aluminum oxide multi-doped with the first, second, and third dopants). In yet further embodiments, the data storage structure 108 may be formed in a processing chamber where the processing chamber is heated to a temperature of about 250 to 300 degrees Celsius during formation of the data storage structure 108. In yet further embodiments, the data storage structure 108 is formed to a thickness within a range of about 10 to 60 angstroms. In various embodiments, the data storage structure 108 may, for example, be formed such that it comprises a compound of the dielectric material, the first dopant, and the second dopant (e.g., AlTaON); a compound of the dielectric material, the first dopant, and the third dopant (e.g., AlHfON); a compound of the dielectric material, the first dopant, the second dopant, and the third dopant (e.g., AlTaHfON); or another suitable material.

In addition, another process for forming the data storage structure 108 may include performing a co-sputter process to deposit a compound comprising aluminum oxide, the second dopant, and the third dopant in a plasma environment (e.g., co-sputtering aluminum oxide, tantalum oxide, and hafnium oxide), where the plasma comprises, for example, nitrogen (e.g., $N_2$). In further embodiments, a process for forming the data storage structure 108 may include performing a CVD process or an ALD process to deposit a compound (e.g., the compound comprises aluminum oxide, tantalum oxide, and hafnium oxide) in a plasma environment, where the plasma comprises $N_2$ or $NH_3$. In yet further embodiments, a process for forming the data storage structure 108 may include performing a CVD process or an ALD process to form a material (e.g., aluminum oxide) in a chamber using a first precursor, a second precursor, and/or a third precursor, in which the first precursor ensures the material is doped with the first dopant, the second precursor ensure the material is doped with the second dopant, and the third precursor ensure the material is doped with the third dopant. In some embodiments, the first precursor may, for example, be or comprise $(NH_4)OH$ or another suitable precursor. In further embodiments, the second precursor may, for example, be or comprise $TaCl_5$, $Ta(OC_2H_5)_5$, or another suitable precursor. In yet further embodiments, the third precursor may, for example, be or comprise $HfCl_4$ or another suitable precursor.

As illustrated in cross-sectional view 1200 of FIG. 12, a capping layer 110 is formed over the data storage structure 108 and a top electrode 112 is formed over the capping layer 110, thereby forming a memory cell layer stack 1202 over the lower interconnect wire 214. In some embodiments, the memory cell layer stack 1202 comprises the bottom electrode 106, the data storage structure 108, the capping layer 110, and the top electrode 112. In further embodiments, the capping layer 110 and/or the top electrode 112 may respectively be formed by, for example, CVD, PVD, ALD, sputtering, electroless plating, electro plating, or another suitable deposition or growth process. Subsequently, a masking layer 1204 is formed over the memory cell layer stack 1202. In some embodiments, the masking layer 1204 covers a middle region of the memory cell layer stack 1202 and leaves a peripheral region of the memory cell layer stack 1202 exposed.

Figure 13:
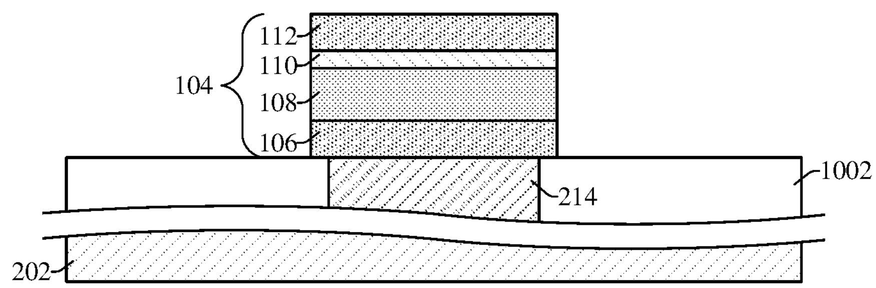

As illustrated in cross-sectional view 1300 of FIG. 13, a patterning process is performed on the memory cell layer stack (1202 of FIG. 12) according to the masking layer (1204 of FIG. 12), thereby forming a memory cell 104. In some embodiments, the pattering process may include: exposing unmasked regions of the memory cell layer stack (1202 of FIG. 12) to one or more etchants; and performing a removal process (not shown) to remove the masking layer (1204 of FIG. 12).

Figure 14:
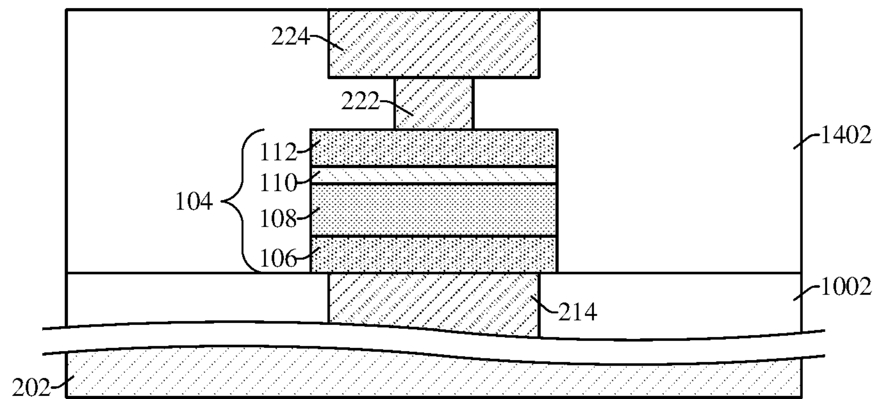

As illustrated in cross-sectional view 1400 of FIG. 14, an upper ILD layer 1402 is formed over and around the memory cell 104, an upper interconnect via 222 is formed over the memory cell 104, and an upper interconnect wire 224 is formed over the upper interconnect via 222. In some embodiments, the upper ILD layer 1402 may, for example, be formed by PVD, CVD, ALD, or another suitable deposition or growth process. In further embodiments, the upper interconnect via and/or wire 222, 224 may, for example, respectively be formed by a single damascene process, a dual damascene process, or another suitable formation process. In some embodiments, the upper ILD layer 1402 may, for example, be or comprise a low-κ dielectric material, an oxide (e.g., silicon dioxide), another suitable dielectric material, or any combination of the foregoing. In various embodiments, the upper interconnect via and wire 222, 224 may, for example, respectively be or comprise aluminum, copper, ruthenium, titanium nitride, tantalum nitride, another conductive material, or any combination of the foregoing.

Figure 15:
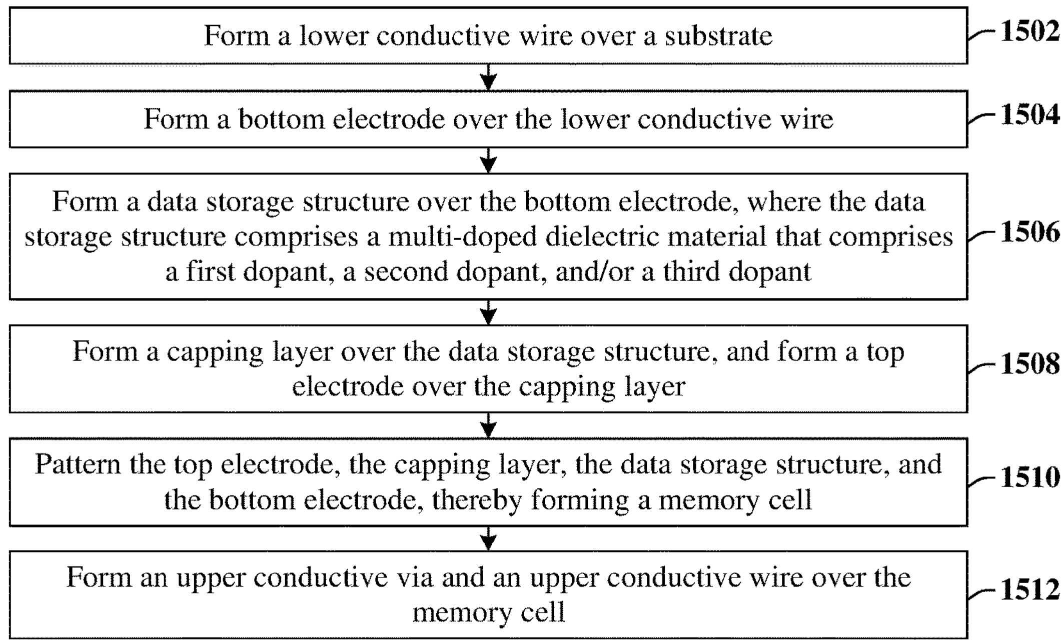
FIG. 15 illustrates a flowchart according to some embodiments of a method for forming a memory cell having a data storage structure that is multi-doped with a first dopant, a second dopant, and/or a third dopant.

FIG. 15 illustrates a method 1500 for forming a memory cell having a data storage structure that is multi-doped with a first dopant, a second dopant, and/or a third dopant according to the present disclosure. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1502, a lower conductive wire is formed over a substrate. FIG. 10 illustrates a cross-sectional view 1000 corresponding to some embodiments of act 1502.

At act 1504, a bottom electrode is formed over the lower conductive wire. FIG. 11 illustrates a cross-sectional view 1100 corresponding to some embodiments of act 1504.

At act 1506, a data storage structure is formed over the bottom electrode, where the data storage structure comprises a multi-doped dielectric material that comprises a first dopant, a second dopant, and/or a third dopant. FIG. 11 illustrates a cross-sectional view 1100 corresponding to some embodiments of act 1506.

At act 1508, a capping layer is formed over the data storage structure and a top electrode is formed over the capping layer. FIG. 12 illustrates a cross-sectional view 1200 corresponding to some embodiments of act 1508.

At act 1510, the top electrode, the capping layer, the data storage structure, and the bottom electrode are patterned, thereby forming a memory cell. FIG. 13 illustrates a cross-sectional view 1300 corresponding to some embodiments of act 1510.

At act 1512, an upper conductive via and an upper conductive wire are formed over the memory cell. FIG. 14 illustrates a cross-sectional view 1400 corresponding to some embodiments of act 1512.

Figure 16:
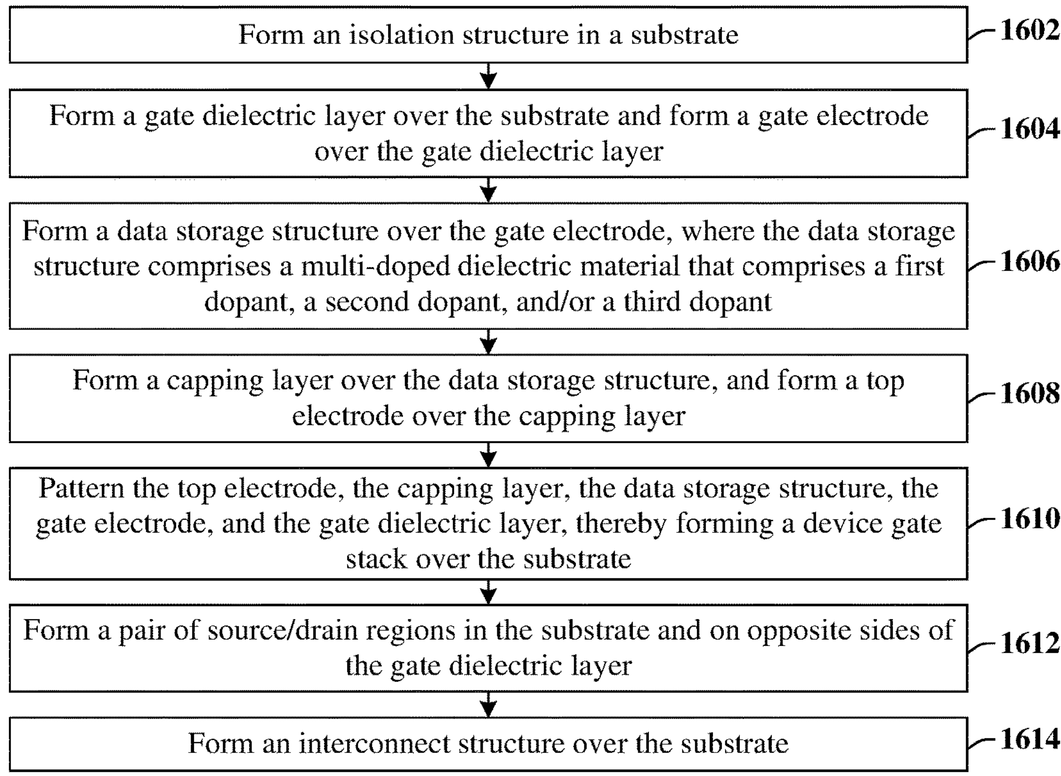
FIG. 16 illustrates a flowchart of some embodiments of a method for forming an integrated chip comprising a front-end-of-line resistive memory cell having a data storage structure that is multi-doped with a first dopant, a second dopant, and/or a third dopant.

FIG. 16 illustrates a method 1600 for forming an integrated chip comprising a front-end-of-line resistive memory cell having a data storage structure that is multi-doped with a first dopant, a second dopant, and/or a third dopant according to the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, an isolation structure is formed in a substrate.

In some embodiments, the isolation structure may be substantially similar to the isolation structure 802 of FIG. 9. In further embodiments, a process for forming the isolation structure may include: patterning the substrate 202 of FIG. 9 to define an isolation structure opening in the substrate 202; depositing (e.g., by PVD, CVD, ALD, etc.) a dielectric material (e.g., silicon dioxide, silicon nitride, silicon carbide, or the like) in the isolation structure opening; and performing a planarization process (e.g., a chemical mechanical planarization (CMP) process) into the dielectric material, thereby defining the isolation structure.

At act 1604, a gate dielectric layer is formed over the substrate and a gate electrode is formed over the gate dielectric layer.

In some embodiments, the gate dielectric layer may be substantially similar to the gate dielectric layer 808 of FIG. 9 and the gate electrode may be substantially similar to the gate electrode 810 of FIG. 9. In further embodiments, the gate dielectric layer and the gate electrode may respectively be deposited by CVD, PVD, ALD, electro plating, electroless plating, or another suitable deposition or growth process.

At act 1606, a data storage structure is formed over the gate electrode, where the data storage structure comprises a multi-doped dielectric material that comprises a first dopant, a second dopant, and/or a third dopant.

In some embodiments, the data storage structure may be substantially similar to the data storage structure 108 of FIG. 9, where the data storage structure comprises the multi-doped data storage layer 602 and the data storage layer 604. In further embodiments, a process for forming the data storage structure may include depositing the multi-doped data storage layer over the gate electrode, and depositing the data storage layer over the multi-doped data storage layer. In some embodiments, the multi-doped data storage layer may be formed over the gate electrode by process(es) substantially similar to process(es) described above regarding formation of the data storage structure 108 of FIG. 11. In further embodiments, the data storage layer may be formed over the multi-doped data storage layer by, for example, CVD, PVD, ALD, co-sputtering, or another suitable deposition or growth process.

At act 1608, a capping layer is formed over the data storage structure, and a top electrode is formed over the capping layer. In some embodiments, the capping layer and the top electrode may be formed over the data storage structure by process(es) substantially similar to process(es) described above regarding formation of the capping layer 110 and the top electrode 112 of FIG. 12.

At act 1610, the top electrode, the capping layer, the data storage structure, the gate electrode, and the gate dielectric layer are patterned, thereby forming a device gate stack over the substrate.

In some embodiments, the device gate stack may be substantially similar to the device gate stack 902 of FIG. 9. In further embodiments, the device gate stack may be patterned by process(es) substantially to process(es) described above regarding the patterning process of FIG. 13.

At act 1612, a pair of source/drain regions are formed in the substrate on opposite sides of the gate dielectric layer.

In some embodiments, the pair of source/drain regions may be substantially similar to the pair of source/drain regions 804*a-b* of FIG. 9. In further embodiments, a process for forming the pair of source/drain regions may include selectively doping the substrate with a second doping type (e.g., n-type).

At act 1614, an interconnect structure is formed over the substrate.

In some embodiments, the interconnect structure may be substantially similar to the interconnect structure 812 of FIG. 9. In such embodiments, the interconnect dielectric structure 816 may be formed by one or more deposition process(es) (e.g., CVD, PVD, ALD, etc.), and the conductive contacts 814, the conductive lines 818, and/or the conductive vias 820 may respectively be formed by a single damascene process, a dual damascene process, or another suitable formation process.

Accordingly, in some embodiments, the present disclosure relates to a memory cell comprising a top electrode, a bottom electrode, and a data storage structure disposed between the top and bottom electrodes, where the data storage structure comprises a dielectric material multi-doped with a first dopant, a second dopant, and/or a third dopant.

In some embodiments, the present application provides a memory device including a substrate; a bottom electrode overlying the substrate; a top electrode overlying the bottom electrode; and a data storage structure disposed between the top electrode and the bottom electrode, wherein the data storage structure comprises a dielectric material doped with a first dopant and a second dopant, wherein the first dopant is different from the second dopant.

In some embodiments, the present application provides an integrated chip including a substrate; and a resistive random access memory (RRAM) cell overlying the substrate, wherein the RRAM cell includes a top electrode, a bottom electrode, and a data storage structure disposed between the top and bottom electrodes, wherein the data storage structure comprises a first high-κ dielectric material and a plurality of dopants, wherein the plurality of dopants comprises a first dopant, a second dopant, and a third dopant that are respectively different from one another.

In some embodiments, the present application provides a method for forming a memory device, the method including: depositing a bottom electrode over a substrate; depositing a data storage structure over the bottom electrode such that the data storage structure comprises a dielectric material doped with a first dopant, a second dopant, and a third dopant; depositing a top electrode over the data storage structure; and performing a patterning process on the bottom electrode, the data storage structure, and the top electrode, thereby forming a memory cell over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

forming a bottom electrode over a substrate;

forming a data storage structure on the bottom electrode, wherein the data storage structure comprises a switching layer and a doped switching layer contacting the switching layer, wherein the doped switching layer comprises a first dopant with a first atomic percent and a second dopant with a second atomic percent, wherein the first atomic percent is different from the second atomic percent; and forming a top electrode on the data storage structure.

2. The method of claim 1, wherein the data storage structure further comprises a third dopant with a third atomic percent different from the first atomic percent and the second atomic percent.

3. The method of claim 2, wherein the first atomic percent is within a range of 5 to 10 percent, the second atomic percent is within a range of 12 to 18 percent, and the third atomic percent is within a range of 15 to 22 percent.

4. The method of claim 1, wherein the data storage structure is formed by a chemical vapor deposition process or an atomic layer deposition process with a first precursor and a second precursor.

5. The method of claim 4, wherein the first precursor comprises nitrogen and the second precursor comprises tantalum.

6. The method of claim 4, wherein the chemical vapor deposition process or the atomic layer deposition process further includes a third precursor different from the first precursor and second precursor.

7. The method of claim 1, further comprising:

forming a masking layer over the top electrode; and performing a patterning process on the bottom electrode, the data storage structure, and the top electrode with the masking layer in place, wherein sidewalls of the bottom electrode, sidewalls of the data storage structure, and sidewalls of the top electrode are aligned.

8. A method for forming an integrated chip, the method comprising:

forming a bottom electrode over a substrate;

forming a data storage structure over the bottom electrode, wherein the data storage structure comprises a high-K dielectric material doped with a first dopant, a second dopant, and a third dopant, wherein atomic percentages of the first dopant, the second dopant, and the third dopant within the high-K dielectric material are different from one another; and forming a top electrode over the data storage structure.

9. The method of claim 8, further comprising:

forming a capping layer between the data storage structure and the top electrode, wherein a thickness of the capping layer is less than a thickness of the data storage structure.

10. The method of claim 8, wherein the data storage structure is formed to a thickness within a range of 10 to 60 angstroms.

11. The method of claim 8, wherein the data storage structure is formed by a sputtering process.

12. The method of claim 8, wherein the data storage structure comprises a dielectric switching layer and a multi-doped data storage layer directly contacting the dielectric switching layer, wherein the multi-doped data storage layer comprises the high-K dielectric material doped with the first dopant, the second dopant, and the third dopant.

13. The method of claim 12, wherein a height of the dielectric switching layer is greater than a height of the multi-doped data storage layer.

14. The method of claim 8, wherein the data storage structure is formed with a temperature within a range of 250 to 300 degrees Celsius.

15. The method of claim 8, wherein the data storage structure is formed by a chemical vapor deposition process or an atomic layer deposition process with $N_2$ or $NH_3$.

16. The method of claim 8, wherein an atomic percentage of a metal element in the high-k dielectric material is less than atomic percentages of the second dopant and the third dopant in the high-K dielectric material.

17. A method for forming a memory device, the method comprising:

depositing a bottom electrode over a substrate;

depositing a data storage layer over the bottom electrode, wherein the data storage layer comprises a dielectric material doped with nitrogen, tantalum, and hafnium;

depositing a top electrode over the data storage layer; and performing a patterning process on the bottom electrode, the data storage layer, and the top electrode, thereby forming a resistive random access memory (RRAM) cell over the substrate.

18. The method of claim 17, wherein the data storage layer comprises a first atomic percentage of nitrogen, a second atomic percentage of tantalum, and a third atomic percentage of hafnium, wherein the first atomic percentage is less than the second atomic percentage, and the second atomic percentage is less than the third atomic percentage.

19. The method of claim 17, further comprising:

forming a gate dielectric layer over the substrate, wherein the gate dielectric layer is disposed between the bottom electrode and the substrate, wherein opposing sidewalls of the gate dielectric layer are aligned with opposing sidewalls of the data storage layer; and forming a pair of source/drain regions in the substrate and on opposite sides of the gate dielectric layer.

20. The method of claim 17, wherein the dielectric material comprises aluminum oxide.

* * * * *